US008654331B2

(12) United States Patent
Iwanami et al.

(10) Patent No.: US 8,654,331 B2
(45) Date of Patent: Feb. 18, 2014

(54) ELECTROMAGNETIC FIELD MEASUREMENT APPARATUS

(75) Inventors: Mizuki Iwanami, Tokyo (JP); Tsuneo Tsukagoshi, Tokyo (JP); Risato Ohhira, Tokyo (JP); Masafumi Nakada, Tokyo (JP); Tomonori Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 519 days.

(21) Appl. No.: 12/865,908

(22) PCT Filed: Feb. 4, 2009

(86) PCT No.: PCT/JP2009/051868
§ 371 (c)(1),
(2), (4) Date: Aug. 3, 2010

(87) PCT Pub. No.: WO2009/099090
PCT Pub. Date: Aug. 13, 2009

(65) Prior Publication Data
US 2011/0001971 A1    Jan. 6, 2011

(30) Foreign Application Priority Data

Feb. 6, 2008   (JP) ................................. 2008-026375

(51) Int. Cl.
*G01J 4/00*   (2006.01)
(52) U.S. Cl.
USPC ........................................................ 356/364
(58) Field of Classification Search
CPC .................................................. G01R 29/0885
USPC ........................................................ 356/364
See application file for complete search history.

(56) References Cited

U.S. PATENT DOCUMENTS

| 5,991,036 | A | * | 11/1999 | Frankel | .......................... | 356/364 |
| 7,511,511 | B2 | * | 3/2009 | Onishi et al. | .................. | 324/632 |

FOREIGN PATENT DOCUMENTS

| JP | 1-163675 A | 6/1989 |
| JP | 6-82490 A | 3/1994 |

(Continued)

OTHER PUBLICATIONS

International Search Report for PCT/JP2009/051868 mailed Apr. 28, 2009.

(Continued)

*Primary Examiner* — Gregory J Toatley
*Assistant Examiner* — Rufus Phillips
(74) *Attorney, Agent, or Firm* — Sughrue Mion, PLLC (57) ABSTRACT

There is provided an electromagnetic field measurement apparatus capable of achieving correct and timely circuit operation detection in an area where electronic devices are mounted at high density. An electromagnetic field measurement apparatus includes: a laser light source; a polarized wave controller that linearly polarizes laser light; an optical fiber probe that has an electrooptic material or a magnetooptic material at its leading end and in which the laser light reflected at the leading end is subjected to polarization modulation in accordance with an electric field intensity or a magnetic field intensity; and an analyzer that converts the laser light reflected by the optical fiber probe into intensity modulated light. The laser light source emits time-multiplexed laser light of a plurality of wavelengths different from one another. The electromagnetic field measurement apparatus further includes: an optical circulator that outputs the laser light linearly polarized by the polarized wave controller to a multiplexer/demultiplexer and outputs the laser light input from the multiplexer/demultiplexer to the analyzer; and a multiplexer/demultiplexer that outputs the laser light to different optical fiber probes according to the wavelength of the laser light and outputs the laser light to the optical circulator.

19 Claims, 6 Drawing Sheets

(56) References Cited

FOREIGN PATENT DOCUMENTS

| | | |
|---|---|---|
| JP | 9-68559 A | 3/1997 |
| JP | 2002005755 A | 1/2002 |
| JP | 2004212137 A | 7/2004 |
| JP | 2005308455 A | 11/2005 |
| WO | 2004107626 A | 12/2004 |
| WO | 2007004691 A | 1/2007 |

OTHER PUBLICATIONS

S. Wakana et al., "Fiber-Edge Electrooptic/Magnetooptic Probe for Spectral-Domain Analysis of Electromagnetic Field". IEEE Transactions on Microwave Theory and Techniques, vol. 48, No. 12, Dec. 2000, pp. 2611-2616.

K. Sasagawa et al., "Real-time monitoring system of RF near-field distribution images on the basis of 64-channel parallel electro-optic data acquisition", IEICE Electronics Express, vol. 2, No. 24, 2005, pp. 600-606.

H. Takara, "Multiple Optical Carrier Generation from Supercontinuum Source", Optics & Photonics News, Mar. 2002, pp. 48-51.

H. Okayama, "Waveguide-Type Optical Wavelength Filters", OKI Technical Review, Issue 192, vol. 69, No. 4, Oct. 2002, pp. 72-75.

\* cited by examiner

ELECTROMAGNETIC FIELD MEASUREMENT APPARATUS

This application is the National Phase of PCT/JP2009/051868, filed Feb. 4, 2009, which is based upon and claims the benefit of priority from Japanese patent application No. 2008-026375, filed on Feb. 6, 2008, the disclosure of which is incorporated herein in its entirety by reference.

TECHNICAL FIELD

The present invention relates to an electromagnetic field measurement apparatus that measures an electromagnetic field by using laser light, an optical fiber, and an electrooptic/magnetooptic material to measure an electromagnetic field generated from an electronic circuit.

BACKGROUND ART

There has been conventionally known a probe that measures an electromagnetic field by using laser light, an optical fiber, and an EO (electrooptic) material/MO (magnetooptic) material, and evaluation results of microwave circuits and antennas obtained by using the probe have been reported (refer to, e.g., NPL 1). The probe includes an optical fiber and an EO/MO material formed at the leading end of the optical fiber. The probe of such a type can perform high spatial resolution measurement on a circuit board or can perform measurement for a minute or narrow area owing to the minuteness of the EO/MO material serving as a sensor element and narrowness of the optical fiber. In general, only one optical fiber probe is used for measurement, and the probe is fixed to a measurement point or made to scan over an object to be measured.

Further, in recent years, there is reported development of a method (electric field camera) in which a tabular EO material having a size of 1 cm to 2 cm square is placed on an object to be measured and is irradiated with laser light having a beam diameter nearly equal to the plane size of the EO material to measure the electric field distribution of the irradiated area instantaneously (refer to, e.g., NPL 2). The probe of such a type can perform measurement of the electric field distribution at extremely short times without making the probe perform scanning.

In the field of optical communication, a wavelength division multiplex (WDM) communication represents a major breakthrough as a method enabling large capacity and high-speed communication. In this method, by utilizing a fact that light of different ranges of wavelengths can be transmitted by the use of an optical fiber, it is possible to transmit optical signals of a plurality of channels at a time (refer to, e.g., NPL 3). As an element essential for such a communication system, development of an optical wavelength filter element serving as a wavelength separation element is currently underway (refer to, e.g., NPL 4).

In the development of a small-sized/sophisticated electronic apparatus typified by a recent mobile phone, a method of designing the electronic apparatus or method of testing the operation thereof becomes a major development item. This is because of that various kinds of electronic devices mounted inside the electronic apparatus at high density operate at high speed, so that malfunction of the devices may occur due to electromagnetic interference inside the apparatus. As the method of the device operation test that has frequently been used, a voltage wavelength measurement using a voltage probe having at its leading end a metal probe can be taken. This method can perform wavelength measurement only by bringing the metal probe into contact with a measurement point (metal portion) in principle, so that it is possible to easily determine the operating state of the device at short times.

CITATION LIST

Patent Literature
{NPL 1} S. Wakana, T. Ohara, M. Abe, E. Yamazaki, M. Kishi, and M. Tsuchiya: "Fiber-Edge Electrooptic/Magnetooptic Probe for Spectral-Domain Analysis of Electromagnetic Field", IEEE Trans. Microwave Theory Tech., Vol. 48, No. 12, pp. 2611-2616 (December 2000)
{NPL 2} K. Sasagawa and M. Tsuchiya, "Real-time monitoring system of RF near-field distribution images on the basis of 64-channel parallel electro-optic data acquisition", IEICE Electronics Express, vol. 2, no. 24, pp. 600-606, 2005
{NPL 3} H. Takara, "Multiple Optical Carrier Generation from a Supercontinuum Source", Optics & Photonics News, pp. 48-51 (March 2002)
{NPL 4} Hideaki Okayama "Waveguide-Type Optical Wavelength Filters", OKI Technical Review, Issue 192 Vol. 69 No. 4, pp. 72-75 (October 2002)

SUMMARY OF INVENTION

Technical Problem

As described above, the conventional optical fiber probe performs measurement at one point or performs planar measurement in a time-consuming manner, so that circuit operation detection in an area where a large number of devices are mounted, such as the entire area or a part of a printed circuit board cannot be achieved in a timely manner.

The use of a tabular EO material and an electric field camera using laser light having a large diameter, both of which have been recently developed, allows achievement of timely operation detection in an area having a size of 1 cm to 2 cm square. However, the operation detection in a wider area cannot be performed, and operation detection in, e.g., a narrow gap between devices cannot be made easily.

Further, in a case where a voltage probe having at its leading end a metal probe is used, measurement can be made only at one point in general as in the case of using the conventional optical fiber probe. Further, in a case of the contact-type probing using a metal probe, charge is induced on the probe at the measurement point, which may cause a drawback. For example, when operation detection is performed using a probe of such a type in a wiring between transmission IC and reception IC, charge is induced on the probe side to generate waveform rounding of a signal to be supplied to the reception IC, which may cause the reception IC to malfunction. That is, malfunction of the device may occur in association with the probing operation.

An object of the present invention is to provide an electromagnetic field measurement apparatus capable of achieving correct and timely circuit operation detection in an area where electronic devices are mounted at high density.

Solution to Problem

According to the present invention, there is provided an electromagnetic field measurement apparatus including: a laser light source that emits laser light; a polarized wave controller that linearly polarizes the laser light emitted from the laser light source; an optical fiber probe that has an electrooptic material or a magnetooptic material at its leading end and in which the laser light reflected at the leading end is subjected to polarization modulation in accordance with an electric field intensity or a magnetic field intensity at the leading end; and an analyzer that converts the laser light reflected by the optical fiber probe into intensity modulated light, wherein the laser light source emits a time-divided laser light of a plurality of wavelengths different from one another, the electromagnetic field measurement apparatus further includes: an optical circulator that outputs the laser light linearly polarized by the polarized wave controller to a multiplexer/demultiplexer and outputs the laser light input from the multiplexer/demultiplexer to the analyzer; and a multiplexer/demultiplexer that outputs the laser light input from the optical circulator to different optical fiber probes according to the wavelength of the laser light and outputs the laser light input from the optical fiber probes to the optical circulator, and the analyzer converts the laser light that is reflected by the optical probes, passed through the multiplexer/demultiplexer and the optical circulator into intensity modulated light.

Advantageous Effects of Invention

By performing multi-point measurement using a plurality of probes, circuit operation determination can be achieved at short times.

DESCRIPTION OF EMBODIMENTS

Preferred exemplary embodiments for practicing the present invention will be described below with reference to the accompanying drawings.

First Exemplary Embodiment

Figure 1:
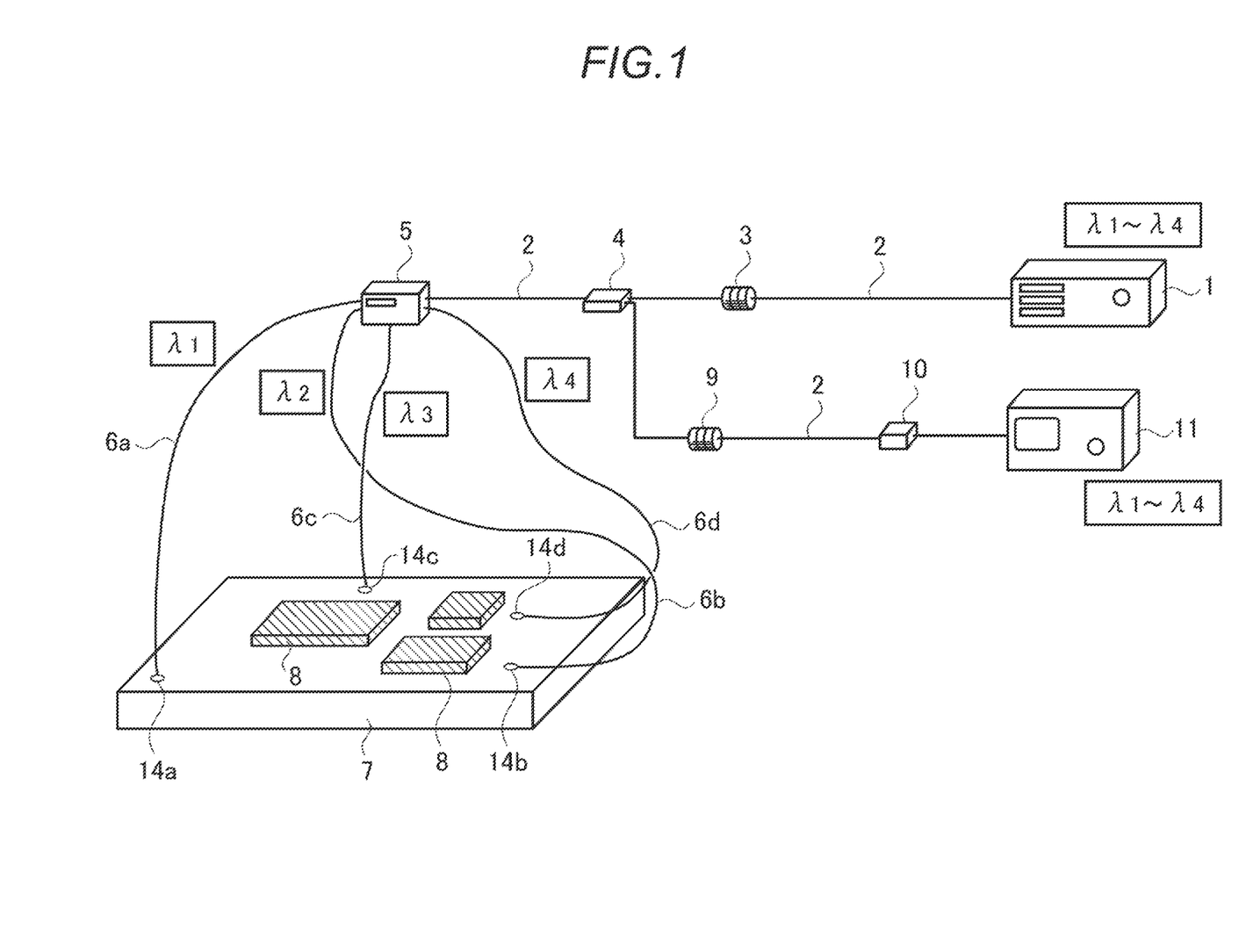
FIG. 1 A view illustrating a first exemplary embodiment of the present invention.

FIG. 1 is a view illustrating a first exemplary embodiment of the present invention. The first embodiment is an apparatus including a laser light source 1, a polarized wave controller 3, an optical circulator 4, a multiplexer/demultiplexer 5, four optical fiber probes 6 (6a, 6b, 6c, 6d), an analyzer 9, a photodetector 10, and a spectrum analyzer 11. The above optical components are connected to one another by an optical fiber 2. Each of the optical fiber probes 6 includes an optical fiber and an EO material or MO material 14 formed on the leading end of the optical fiber and is previously set, e.g., over a printed circuit board 7, or near a semiconductor package 8. A probe having an EO material at its leading end serves as an electric field probe, and a probe having an MO material at its leading end serves as a magnetic field probe. The laser light source has a variable wavelength and sequentially emits light of four wavelengths: λ1 to λ4 in accordance with the number of the optical fiber probes. The laser light is linearly polarized by the polarized wave controller 3, passed through the optical circulator 4, enters the multiplexer/demultiplexer 5 where an optical path is determined for each wavelength, and finally enters the optical fiber probe 6 through the determined optical path. By using the multiplexer/demultiplexer 5, the optical path can be determined such that, for example, light of λ1 enters the probe 6a and light of λ2 enters the probe 6b. After that, the light enters the EO/MO material 14 at the leading end of the probe, propagates in the material, is reflected by the bottom surface of the material, and returns to the optical fiber 6 and, during this course, the light is subjected to polarization modulation in accordance with an external electric field/magnetic field intensity. In the case of the EO material, modulation corresponding to the electric field intensity is generated, and in the case of the MO material, modulation corresponding to the magnetic field intensity is generated. The light subjected to the polarization modulation is again passed through the multiplexer/demultiplexer 5 and the optical circulator 4, converted into intensity modulated light in the analyzer 9, and subjected to photoelectric conversion in the photodetector 10. After that, electric field intensity/magnetic field intensity-based signal measurement is performed by the spectrum analyzer 11. In the case of the present exemplary embodiment, laser light of four wavelengths λ1 to λ4 is sequentially emitted, and electric field or magnetic field detection is sequentially performed by the optical fiber probe corresponding to respective wavelengths. By performing multi-point measurement using the plurality of optical fiber probe, the circuit operation evaluation can be achieved at short times. Although four optical fiber probes are used in the present embodiment, the number of the probes is not limited to this. Further, an optical fiber amplifier may be disposed between the laser light source 1 and the polarized wave controller 3 or between the analyzer 9 and the photodetector 10 as needed. The use of polarization maintaining optical fibers that are used as the optical fiber for connecting the optical components and optical fibers for probes allows the laser light to be stably transmitted in a linearly polarized state, thereby eliminating the need to provide the polarized wave controller 3. Further, the signal measuring device is not limited to the spectrum analyzer mentioned and may be, for example, an oscilloscope or multimeter.

Second Exemplary embodiment

Figure 2:
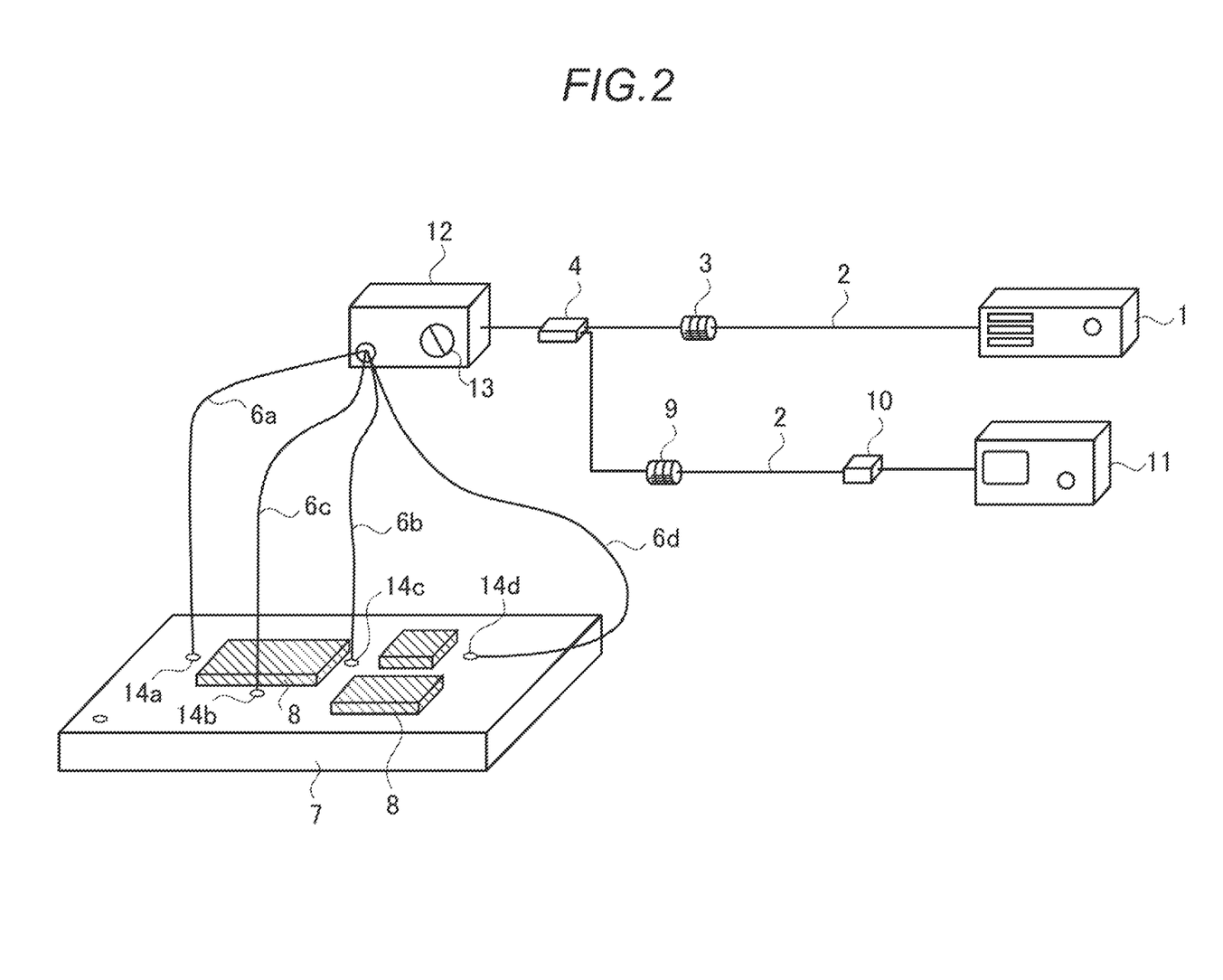
FIG. 2 A view illustrating a second exemplary embodiment of the present invention.

FIG. 2 is a view illustrating a second exemplary embodiment of the present invention. The laser light source 1 emits light of a single wavelength. The light emitted from the laser light source 1 can be made to enter an arbitrary one of the optical fiber probes 6a to 6d by an optical switch 12. The optical switch has an optical path selection channel 13 and a destination optical fiber probe can be selected by switching of the channel. The electromagnetic field measurement principle is the same as above. The optical path selection channel of the optical switch is sequentially switched so that laser light of a single wavelength enters the respective probes, and electric field or magnetic field detection is sequentially performed by means of the respective optical fiber probes. By performing multi-point measurement using the plurality of optical fiber probes, the circuit operation evaluation can be achieved at short times. Although four optical fiber probes are used also in the present embodiment, the number of the probes is not limited to this.

Third Exemplary Embodiment

Figure 3:
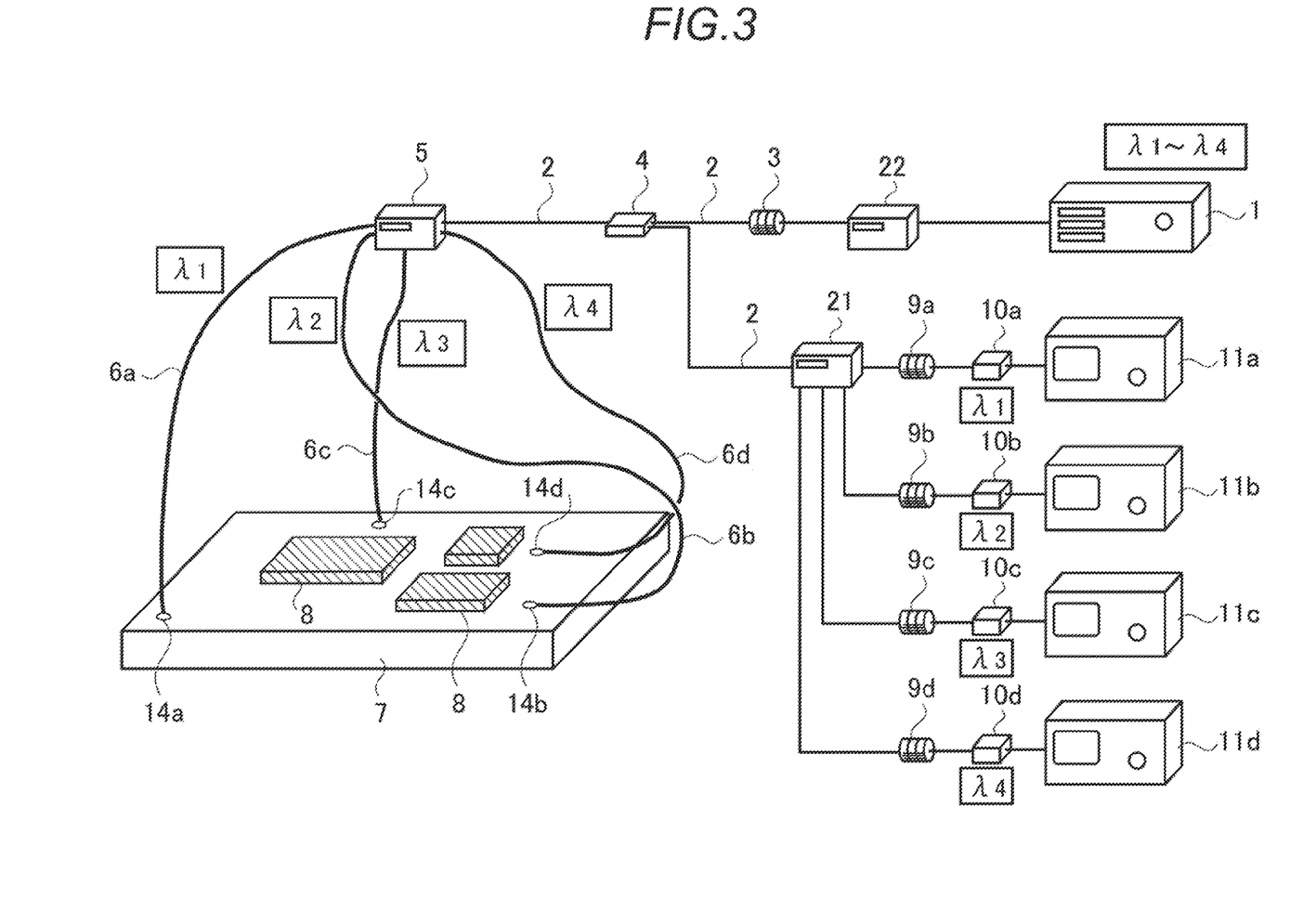
FIG. 3 A view illustrating a third exemplary embodiment of the present invention.

FIG. 3 is a view illustrating a third exemplary embodiment of the present invention. A light source that can simultaneously emit lights of a plurality of wavelengths is used as the laser light source 1. One of the features of the optical fiber is to be able to transmit light of a plurality of wavelengths by one fiber without interference. The present embodiment has been made by aggressively utilizing this feature. Lights of four wavelengths from λ1 to λ4 are simultaneously emitted in accordance with the number of the optical fiber probes. The emitted laser light is linearly polarized by the polarized wave controller 3, passed through the optical circulator 4, enters the multiplexer/demultiplexer 5 where optical paths are determined for each wavelength, and finally enters the optical fiber probes 6 through the determined optical paths. By using the multiplexer/demultiplexer 5, the optical path can be determined such that, for example, light of λ1 enters the probe 6a and light of λ2 enters the probe 6b. After that, as described above, the light enters the EO/MO materials 14 at the probe leading ends and subjected to modulation therein and passed through the multiplexer/demultiplexer 5 to be transmitted by one fiber as modulated wave. Then, the modulated light is again passed through the optical circulator 4 and enters another multiplexer/demultiplexer 21 where the light is divided into light of wavelengths λ1 to λ4. The light of wavelengths λ1 to λ4 is subjected to intensity modulation in the respective analyzers 9, subjected to photoelectric conversion in the respective photodetectors 10, and then subjected to signal measurement in the respective spectrum analyzers 11. The electromagnetic field measurement principle is the same as above. In the case of the present embodiment, laser lights of four wavelengths from λ1 to λ4 are simultaneously emitted, and electric field or magnetic field detections are simultaneously performed by means of the optical fiber probes corresponding to the four wavelengths. By performing simultaneous multi-point measurement using the plurality of optical fiber probes and plurality of signal measurement devices with a WDM technique applied to the probe device, the circuit operation detection can be achieved in a timely manner. Also in the present embodiment, the number of the probes is not limited to four.

Fourth Embodiment

Figure 4:
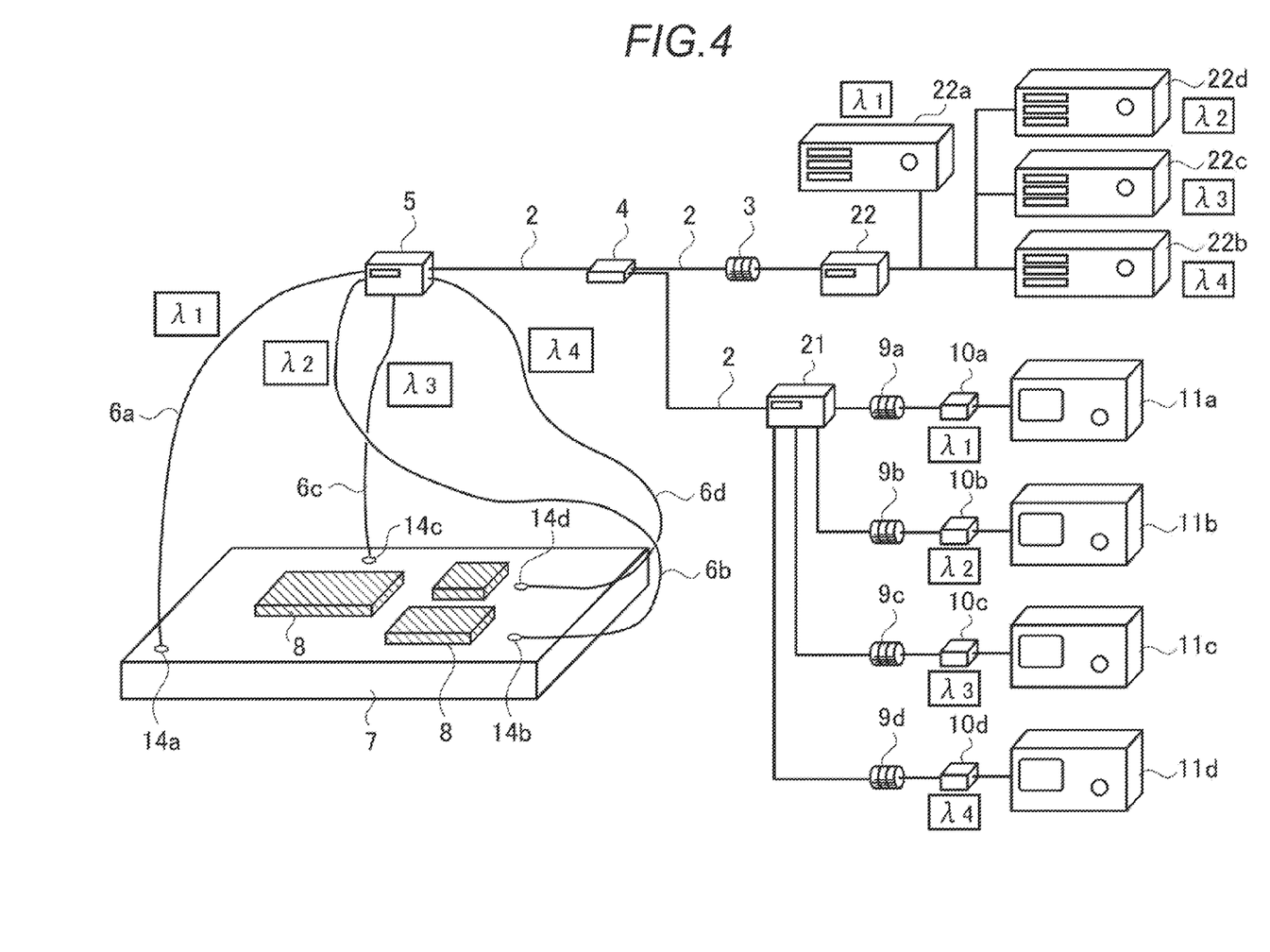
FIG. 4 A view illustrating a fourth exemplary embodiment of the present invention.

FIG. 4 is a view illustrating a fourth embodiment of the present invention. A plurality of laser light sources 22a, 22b, 22c, and 22d are used to simultaneously emit lights of different wavelengths. Lights of four wavelengths from λ1 to λ4 are simultaneously emitted in accordance with the number of the optical fiber probes. The emitted laser lights are multiplexed in a multiplexer/demultiplexer 22. The multiplexed laser light is then linearly polarized by the polarized wave controller 3, passed through the optical circulator 4, enters another multiplexer/demultiplexer 5 where optical paths are determined for each wavelength, and finally enters the optical fiber probes 6 (6a, 6b, 6c, and 6d) through the determined optical paths. The subsequent optical path is the same as in the third embodiment. In the case of the present embodiment, laser lights of four wavelengths from λ1 to λ4 are simultaneously emitted using the light sources 22a, 22b, 22c, and 22d, and electric field or magnetic field detections are simultaneously performed by means of the optical fiber probes 6 (6a, 6b, 6c, and 6d) corresponding to the four wavelengths: By performing simultaneous multi-point measurement using the plurality of optical fiber probes 6 (6a, 6b, 6c, and 6d) and plurality of signal measurement devices 11a, 11b, 11c and 11d with a WDM technique applied to the probe device, the circuit operation detection can be achieved in a timely manner. Also in the present embodiment, the number of the probes is not limited to four.

With an apparatus in which the multiplexer/demultiplexer 5 or optical switch 12 is incorporated in the optical fiber electromagnetic field probe device, and a plurality of the optical fiber probes 14 and/or a plurality of signal measurement devices 11 are used, multi-point electromagnetic field measurement can be achieved in a wide area where devices are mounted at high density, thereby allowing correct circuit operation evaluation to be achieved at short times.

Further, with an apparatus in which a WDM communication technique is applied to the optical fiber electromagnetic field probe device, and a plurality of the optical fiber probes 14 and a plurality of signal measurement devices 11 are used, simultaneous multi-point electromagnetic field measurement can be achieved in a wide area where devices are mounted at high density, allowing correct circuit operation detection to be achieved at short times.

According to the present exemplary embodiment, by performing multi-point measurement using a plurality of the optical fiber probes, circuit operation evaluation can be achieved at short times.

Further, according to the exemplary embodiment, by performing simultaneous multi-point measurement using a plurality of the optical fiber probes and a plurality of the signal measurement devices with a WDM technique applied to the probe device, circuit operation detection can be achieved in a timely manner.

EXAMPLE

An example of the present invention will be described with reference to the drawings.

An example of an apparatus according to the present invention is an apparatus in which a supercontinuum light source (NPL 3) is used as the light source 1 and an array waveguide grating element (NPL 4) is used as the multiplexer/demultiplexer 5 in the configuration of e.g., FIG. 3. For example, light of four wavelengths around 1.55 μm used in optical fiber communication are selected in accordance with the number of the probes used, the supercontinuum light source is used to simultaneously emit lights of the selected wavelengths, and multiplexer/demultiplexer incorporating the array waveguide grating element is used to thereby achieve four-point simultaneous electromagnetic field measurement.

Figure 5:
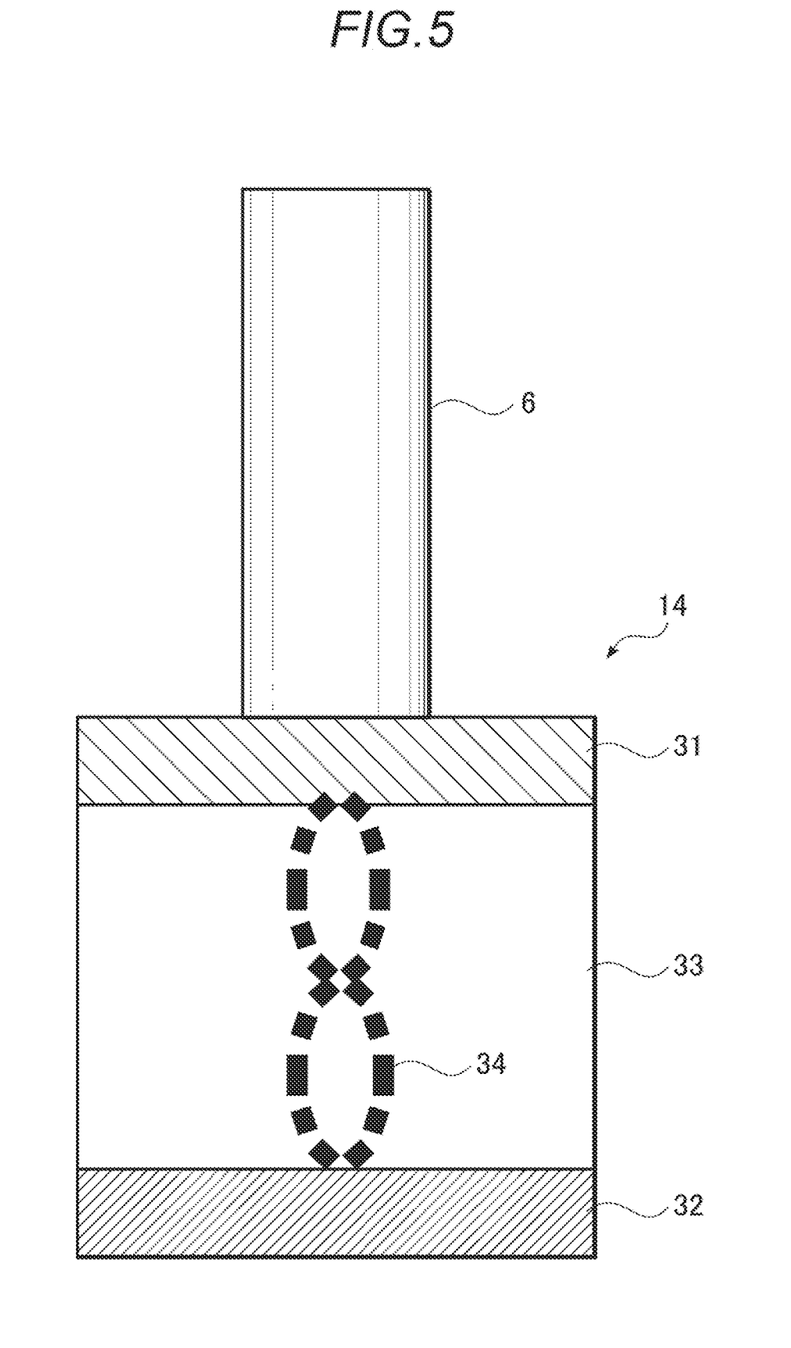
FIG. 5 A conceptual view of a probe having a resonator structure according to the present invention.

In addition to the use of the light source and multiplexer/demultiplexer, a configuration may be adopted in which the probes 6a to 6d are made more sensitive to the wavelengths λ1 to λ4. For example, as illustrated in FIG. 5, light reflecting films 31 and 32 are formed on the front and bottom surfaces of an EO/MO material 33. At this time, the reflectance of the light reflecting film 31 is made lower than that of the light reflecting film 32. For example, the reflectance of the light reflecting film 31 is set to about 80%, and reflectance of the light reflecting film 32 is set to 97% or more. By designing the probe structure to be a resonator structure as described above, resonance (standing wave 34) occurs in the material at a specified wavelength, which increases the EO or MO effect to thereby realize a probe with higher sensitivity. The resonance wavelength is represented by the following expression 1:

$$\lambda res = 2nl \cos\theta/m \quad \text{(expression 1)}$$

wherein
$\lambda res$ is resonance wavelength
n is refractive index of EO/MO material
l is thickness of EO/MO material
θ is refraction angle of incident light
m is integer number Thus, if the refractive index and thickness of the material is known, the light source wavelength achieving high sensitivity can be determined. In a case where the light source wavelength has been determined, material design for achieving a high sensitive probe can be made using the expression 1.

Further, in addition to the use of the light source and multiplexer/demultiplexer, a configuration may be made in which the leading end of each of the probes 6a to 6d may be microminiaturized. To this end, an aerosol deposition method is used to directly form an EO or MO film on the edge surface of the optical fiber. By using the aerosol deposition method, it is possible to form the EO or MO film having the same width equivalent to the fiber diameter and a thickness of as small as several μm to several tens of μm, thereby realizing a microminiature probe. The composition of EO film preferably includes zirconate titanate and lanthanum-added zirconate titanate, and the composition of the MO film preferably includes ferrite having a garnet structure, a spinel structure, or a hexagonal structure.

Figure 6:
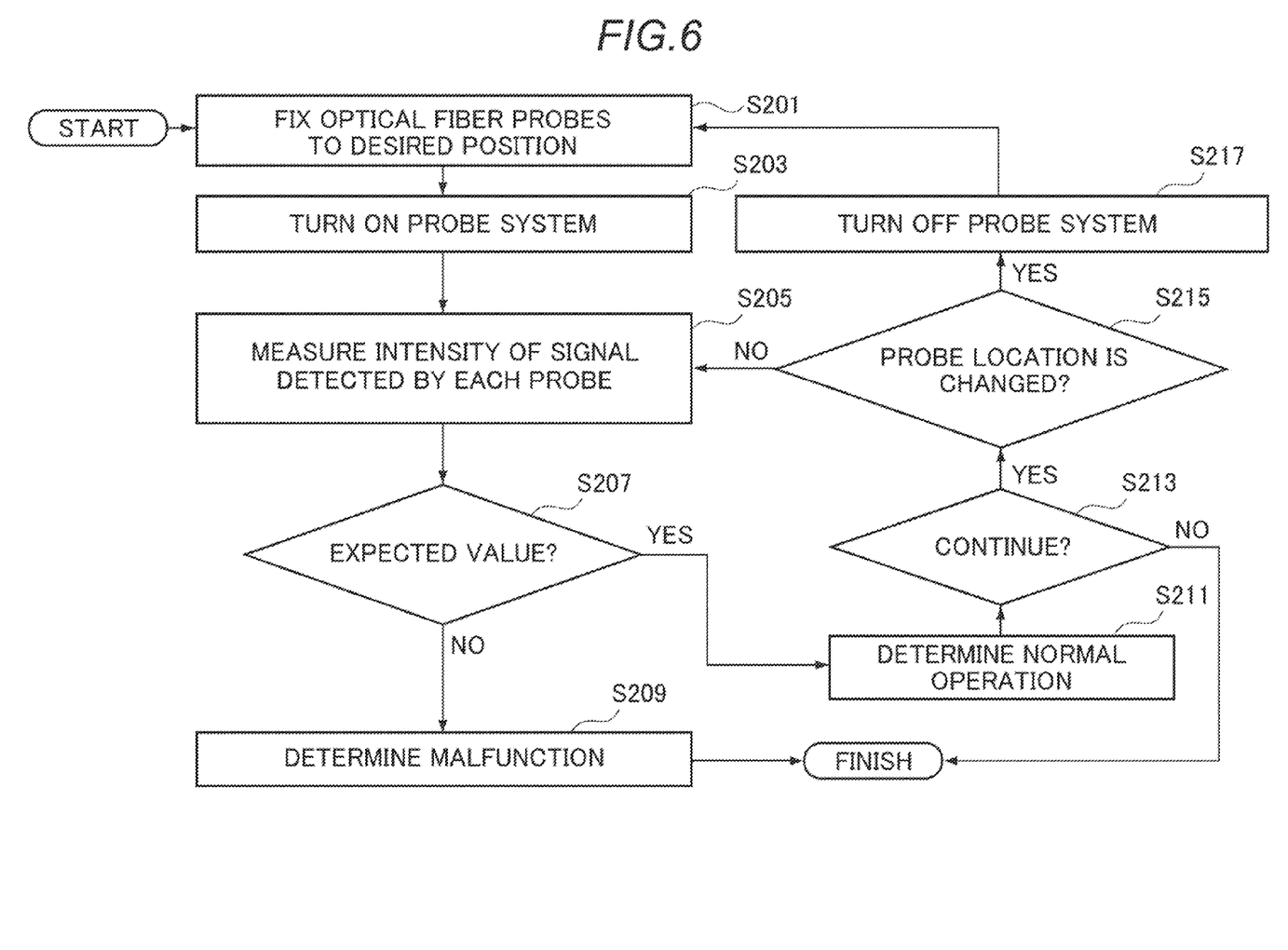
FIG. 6 A flowchart for explaining a circuit operation detection system according to the present invention.

It is possible to realize a circuit operation detection system targeting, e.g., a printed circuit board by using the apparatus illustrated in any of FIGS. 1 to 4. The system is configured to determine normal operation or malfunction as illustrated in FIG. 6. Several probes are previously set at desired locations, and it is determined whether the intensity of a signal detected by each of the probes is an expected value or not, whereby normal operation or malfunction is determined.

Referring to FIG. 6, the optical fiber probes are fixed to desired locations (step S201). The probe system is turned ON (step S203). The intensity of a signal detected by each probe is measured (step S205). It is determined whether the intensity of each signal detected in step S205 is an expected value or not (step S207). If the intensity of each signal is not an expected value (No in S207), malfunction is determined (step S209). If the intensity of each signal is an expected value (Yes in S207), normal operation is determined (step S211). When it is determined after step S211 that the detection operation is not continued (No in step S213), the measurement is ended. When it is determined after step S211 that the detection operation is continued (Yes in step S213), it is determined whether the locations of the probes are changed or not (step S215). When it is determined that the locations of the probes are not changed (No in step S215), the flow shifts to step S205. When it is determined that the locations of the probes are changed (Yes in step S215), the probe system is turned OFF (step S217) to cause the flow to shift to step S201 where the optical fiber probes are fixed to different desired locations, followed by advancing to step S203.

By performing the multi-point measurement using a plurality of probes, circuit operation determination can be achieved at short times. Further, the simultaneous multi-point measurement can be achieved by using the apparatus illustrated in FIG. 3 or FIG. 4, so that it is possible to achieve the circuit operation determination in a timely manner and, in addition, to detect, for example, simultaneous malfunctions occurring at a plurality of locations.

Although the exemplary embodiments of the present invention have been described in detail, it should be understood that various changes, substitutions and alternatives can be made therein without departing from the sprit and scope of the invention as defined by the appended claims. Further, it is the inventor's intent to retain all equivalents of the claimed invention even if the claims are amended during prosecution.

INDUSTRIAL APPLICABILITY

The present invention may be applied as an electromagnetic field measurement apparatus serving as an implementation/electrical design support tool or a circuit diagnostic tool. That is, by performing electromagnetic field measurement on an LSI or around an LSI package using the apparatus according to the present invention, it is possible to acquire information for feeding back to electric design or to perform circuit operation verification.

REFERENCE SIGNS LIST

1: Laser light source
2: Optical fiber
3: Polarized wave controller
4: Optical circulator
5: Multiplexer/demultiplexer
6, 6a, 6b, 6c, 6d: Optical fiber probe
7: Printed circuit board
8: Semiconductor package
9: Analyzer
10: Photodetector
11: Spectrum analyzer
12: Optical switch
13: Optical path selection channel
14a, 14b: Light reflecting film
15: EO/MO material
16: Standing wave

The invention claimed is:

1. An electromagnetic field measurement apparatus, comprising:
a laser light source that emits time-multiplexed laser light of plurality of wavelengths different from one another;
a polarized wave controller that linearly polarizes the laser light emitted from the laser light source;
a plurality of optical fiber probes, each of which has an electrooptic material or a magnetooptic material at its leading end and in each of which the laser light reflected at the leading end is subjected to polarization modulation in accordance with an electric filed intensity or a magnetic field intensity at the leading end;
an analyzer that converts the laser light reflected by each of the plurality of optical fiber probes into intensity modulated light;
an optical circulator that outputs the laser light linearly polarized by the polarized wave controller to a multiplexer/demultiplexer and outputs the laser light input from the multiplexer/demultiplexer to the analyzer; and
a multiplexer/demultiplexer that outputs the laser light input from the optical circulator to the plurality of respective optical fiber probes according to the wavelength of the laser light and outputs the laser light input from the plurality of respective optical fiber probes to the optical circulator,
wherein the analyzer converts the laser light that is reflected by the optical probes, passed through the multiplexer/demultiplexer and the optical circulator into the intensity modulated light, and
wherein the electooptic material or the magnetooptic material at the leading end of each of the plurality of optical fiber probes functions as a sole sensor of the optical fiber probe for measuring the electric field intensity or the magnetic field intensity at the leading end of the optical fiber probe.

2. The electromagnetic field measurement apparatus according to claim 1, further comprising one or more photodetectors, each of which applies photoelectric conversion to the laser light that has been converted into intensity modulated light by each of said one or more analyzers.

3. The electromagnetic field measurement apparatus according to claim 1, wherein the leading end of each of the plurality of optical fiber probes has a resonator structure.

4. The electromagnetic field measurement apparatus according to claim 1, wherein the electrooptic or magnetooptic material is formed by an aerosol deposition method.

5. The electromagnetic field measurement apparatus according to claim 1, wherein the composition of the electrooptic material includes zirconate titanate and lanthanum-added zirconate titanate.

6. The electromagnetic field measurement apparatus according to claim 1, wherein the composition of the magnetooptic material includes ferrite having a garnet structure, a spinel structure, or a hexagonal structure.

7. The electromagnetic field measurement apparatus according to claim 1,
wherein each of the plurality of optical fiber probes is flexible so that the electrooptic material or the magietooptic material at its leading end is fixed to a measurement point or scan over an object to be measured.

8. An electromagnetic field measurement apparatus comprising:
one or more laser light sources, each of said laser light sources emits laser light, said one or more laser light sources emitting laser light including a plurality of wavelengths together, the plurality of wavelengths being simultaneously included in the laser light;
a polarized wave controller that linearly polarizes each of the laser lights emitted from the laser light sources with respect to the plurality of wavelengths;
a plurality of optical fiber probes, each of which has an electrooptic material or a magnetooptic material at its leading end and in each of which the laser light reflected at the leading end is subjected to polarization modulation in accordance with an electric field intensity or a magnetic field intensity at the leading end, the plurality of optical fiber probes respectively corresponding to the plurality of wavelengths;
one or more analyzers, each of said analyzers converts the laser light reflected by each of the plurality of optical fiber probes into intensity modulated light with respect to the plurality of wavelengths;
an optical circulator that outputs the laser light linearly polarized by the polarized wave controller to an input/output unit and outputs the laser light input from the input/output unit to said one or more analyzers with respect to the plurality of wavelengths; and
the input/output unit that outputs the laser light input from the optical circulator to the plurality of optical fiber probes and outputs the laser light input from the plurality of respective optical fiber probes to the optical circulator, the laser light which is input from the optical circulator including the plurality of wavelengths simultaneously, the laser lights which are respectively output to the plurality of optical fiber probes respectively corresponding to the plurality of wavelengths and being simultaneously output to the plurality of optical fiber probes,
wherein each of said one or more respective analyzers converts the laser light that is reflected by each of the plurality of optical probes, passed through the input/output unit and the optical circulator into the intensity modulated light.

9. The electromagnetic field measurement apparatus according to claim 8, wherein said one or more laser light sources are a plurality of laser light sources, each of which outputs laser light of a single wavelength.

10. The electromagnetic field measurement apparatus according to claim 8, wherein said one or more laser light sources is a single laser light source that emits laser light including a plurality of wavelengths.

11. The electromagnetic field measurement apparatus according to claim 10, comprising:
a laser light source that simultaneously emits laser lights of a plurality of wavelengths different from one another;
a polarized wave controller that linearly polarizes the laser lights emitted from the laser light source;
a plurality of optical fiber probes, each of which has an electrooptic material or a magnetooptic material at its leading end and in each of which the laser light reflected at the leading end is subjected to polarization modulation in accordance with an electric field intensity or a magnetic field intensity at the leading end;
a plurality of analyzers, each of which converts the laser light reflected by each of the plurality of optical fiber probes into intensity modulated light;
an optical circulator that outputs the laser light linearly polarized by the polarized wave controller to a multiplexer/demultiplexer and outputs the laser light input from the multiplexer/demultiplexer to the plurality of analyzers;
a multiplexer/demultiplexer that outputs the laser light input from the optical circulator to the plurality of respective optical fiber probes according to the wavelength of the laser light and outputs the laser light input from the plurality of respective optical fiber probes to the optical circulator; and
a second multiplexer/demultiplexer that outputs the laser light that is reflected by the optical probes and passed through the multiplexer/demultiplexer and the optical circulator to the plurality of respective analyzers according to the wavelength of the laser light,
wherein each of the plurality of respective analyzers converts the laser light input from the second multiplexer/demultiplexer into the intensity modulated light.

12. The electromagnetic field measurement apparatus according to claim 9, comprising:
a plurality of laser light sources, each of which emits laser light of wavelength different from wavelengths of laser lights which are emitted from other laser light sources;
a polarized wave controller that linearly polarizes the laser light emitted from each of the plurality of laser light sources;
a plurality of optical fiber probes, each of which has an electrooptic material or a magnetooptic material at its leading end and in each of which the laser light reflected at the leading end is subjected to polarization modulation in accordance with an electric field intensity or a magnetic field intensity at the leading end;
a plurality of analyzers, each of which converts the laser light reflected by each of the plurality of optical fiber probes into intensity modulated light,
an optical circulator that outputs the laser light linearly polarized by the polarized wave controller to a multiplexer/demultiplexer and outputs the laser light input from the multiplexer/demultiplexer to the plurality of analyzers;
a multiplexer/demultiplexer that outputs the laser light input from the optical circulator to the plurality of respective optical fiber probes according to the wavelength of the laser light and outputs the laser light input from the plurality of respective optical fiber probes to the optical circulator; and a second multiplexer/demultiplexer that outputs the laser light that is reflected by the optical probes and passed through the multiplexer/demultiplexer and the optical circulator to the plurality of respective analyzers according to the wavelength of the laser light, wherein each of the plurality of respective analyzers converts the laser light input from the second multiplexer/demultiplexer into the intensity modulated light.

13. An electromagnetic field measurement method comprising:

a step in which each of one or more laser light sources emits laser light, said one or more laser light sources emitting laser light including a plurality of wavelengths together, the plurality of wavelengths being simultaneously included in the laser light;

a step in which a polarized wave controller linearly polarizes each of the laser lights emitted from the laser light sources with respect to the plurality of wavelengths;

a step in which the laser lights, each of said laser lights being reflected at the leading end of each of a plurality of optical fiber probes, each of which has an electrooptic material or a magnetooptic material at its leading end, is subjected to polarization modulation in accordance with an electric field intensity or a magnetic field intensity at the leading end, the plurality of optical fiber probes respectively corresponding to the plurality of wavelengths;

a step in which each of one or more analyzers converts the laser light reflected by each of the plurality of optical fiber probes into intensity modulated light with respect to the plurality of wavelengths;

a step in which an optical circulator outputs the laser light linearly polarized by the polarized wave controller to an input/output unit and outputs the laser light input from the input/output unit to said one or more analyzers with respect to the plurality of wavelengths;

a step in which the input/output unit outputs the laser light input from the optical circulator to the plurality of optical fiber probes and outputs the laser light input from the plurality of respective optical fiber probes to the optical circulator, the laser light which is input from the optical circulator including the plurality of wavelengths simultaneously, the laser lights which are respectively output to the plurality of optical fiber probes respectively corresponding to the plurality of wavelengths and being simultaneously output to the plurality of optical fiber probes; and a step in which said one or more respective analyzers each convert the laser light that is reflected by each of the plurality of optical probes, passed through the input/output unit and the optical circulator into the intensity modulated light.

14. The electromagnetic field measurement apparatus according to claim 8, further comprising one or more photodetectors, each of which applies photoelectric conversion to the laser light that has been converted into intensity modulated light by each of said one or more analyzers.

15. The electromagnetic field measurement apparatus according to claim 8, wherein the leading end of each of the plurality of optical fiber probes has a resonator structure.

16. The electromagnetic field measurement apparatus according to claim 8, wherein the electrooptic or magnetooptic material is formed by an aerosol deposition method.

17. The electromagnetic field measurement apparatus according to claim 8, wherein the composition of the electrooptic material includes zirconate titanate and lanthanum-added zirconate titanate.

18. The electromagnetic field measurement apparatus according to claim 8, wherein the composition of the magnetooptic material includes ferrite having a garnet structure, a spinel structure, or a hexagonal structure.

19. An electromagnetic field measurement method comprising:

a step in which a laser light source that emits time-multiplexed laser light of plurality of wavelengths different from one another;

a step in which a polarized wave controller that linearly polarizes the laser light emitted from the laser light source;

a step in which a plurality of optical fiber probes, each of which has an electrooptic material or a magnetooptic material at its leading end and in each of which the laser light reflected at the leading end is subjected to polarization modulation in accordance with an electric filed intensity or a magnetic field intensity at the leading end;

a step in which an analyzer that converts the laser light reflected by each of the plurality of optical fiber probes into intensity modulated light;

a step in which an optical circulator that outputs the laser light linearly polarized by the polarized wave controller to a multiplexer/demultiplexer and outputs the laser light input from the multiplexer/demultiplexer to the analyzer; and a step in which a multiplexer/demultiplexer that outputs the laser light input from the optical circulator to the plurality of respective optical fiber probes according to the wavelength of the laser light and outputs the laser light input from the plurality of respective optical fiber probes to the optical circulator, wherein the analyzer converts the laser light that is reflected by the optical probes, passed through the multiplexer/demultiplexer and the optical circulator into the intensity modulated light, and wherein the electooptic material or the magnetooptic material at the leading end of each of the plurality of optical fiber probes functions as a sole sensor of the optical fiber probe for measuring the electric field intensity or the magnetic field intensity at the leading end of the optical fiber probe.

* * * * *